United States Patent
Sato (10) Patent No.: US 6,862,079 B2
(45) Date of Patent: Mar. 1, 2005

(54) LIGHT SOURCE, LIGHT SOURCE GENERATION CONTROL METHOD, EXPOSURE APPARATUS AND MAINTENANCE METHOD THEREFOR, AND SEMICONDUCTOR DEVICE MANUFACTURING METHOD AND SEMICONDUCTOR PRODUCTION FACILITY

(75) Inventor: Mitsuya Sato, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 91 days.

(21) Appl. No.: 10/286,813

(22) Filed: Nov. 4, 2002

(65) Prior Publication Data

US 2003/0090643 A1 May 15, 2003

(30) Foreign Application Priority Data

Nov. 13, 2001 (JP) ........................................ 2001-347473

(51) Int. Cl.$^7$ ..................... G03B 27/72; G03B 27/42; G03B 27/54; H01S 3/00
(52) U.S. Cl. ................ 355/69; 53/67; 372/20
(58) Field of Search ............................. 355/53, 67, 69, 355/77; 372/20, 29.01

(56) References Cited

U.S. PATENT DOCUMENTS

| | | | | |
|---|---|---|---|---|
| 4,905,041 A | * | 2/1990 | Aketagawa | ................... 355/53 |
| 4,977,426 A | * | 12/1990 | Hirose | .......................... 355/53 |
| 5,373,515 A | * | 12/1994 | Wakabayashi et al. | ......... 372/20 |
| 5,608,492 A | | 3/1997 | Sato | ............................ 355/68 |
| 6,385,497 B1 | * | 5/2002 | Ogushi et al. | .............. 700/110 |
| 6,628,682 B1 | * | 9/2003 | Takehisa et al. | ........ 372/29.022 |

* cited by examiner

*Primary Examiner*—Alan Mathews
(74) *Attorney, Agent, or Firm*—Fitzpatrick, Cella, Harper & Scinto

(57) ABSTRACT

In a step S1, an excimer laser control unit sets a central wavelength command value, an integral spectrum distribution command value, and an exposure pulse number in a laser internal control unit. In a step S2, the laser internal control unit receives the central wavelength command value, the integral spectrum distribution command value, and the exposure pulse number from the excimer control unit, and executes an actual exposure when an exposure command is received. In a step S3, the laser internal control unit, after executing exposure, measures the central wavelength of the pulse and the spectral distribution, and corrects any discrepancy between the actually measured central wavelength and the central wavelength command value by outputting a drive command to the narrow-band module so that the central wavelength of the succeeding pulse substantially matches the central wavelength command value. In a step S4, spectral distribution data is integrated with each exposure.

8 Claims, 9 Drawing Sheets

```
URL  http://www.maintain.co.jp/db/input.html

TROUBLE DB INPUT WINDOW

DATE OF OCCURRENCE  [2000/3/15] ~404
MODEL  [*********] ~401
SUBJECT MATTER  [OPERATING MALFUNCTION (ERROR AT BOOTING)] ~403
DEVICE S/N  [465NS4580001] ~402
DEGREE OF URGENCY  [D] ~405
CONDITION  [LED CONTINUES FLASHING AFTER
            POWER IS TURNED ON] ~406
COUNTERMEASURE  [POWER TURNED ON AGAIN
METHOD          (RED BUTTON PUSHED AT START UP)] ~407
PROGRESS  [TEMPORARY MEASURES COMPLETED] ~408
REPORT
(SEND) (RESET)        410              411              412
               LINK TO DATABASE OF RESULTS  SOFTWARE LIBRARY  OPERATION GUIDE
```

FIG. 8

FLOW OF SEMICONDUCTOR DEVICE MANUFACTURE

FIG. 9

WAFER PROCESS

LIGHT SOURCE, LIGHT SOURCE GENERATION CONTROL METHOD, EXPOSURE APPARATUS AND MAINTENANCE METHOD THEREFOR, AND SEMICONDUCTOR DEVICE MANUFACTURING METHOD AND SEMICONDUCTOR PRODUCTION FACILITY

FIELD OF THE INVENTION

The present invention relates to an exposure apparatus and a light source for such exposure apparatuses used in semiconductor production processes utilized in the manufacture of a variety of devices, including, for example, semiconductor chips such as ICs and LSIs, display devices such as LCD panels, detection devices such as magnetic heads or image-sensing devices such as CCDs and the like, and more particularly, to a technique for stabilizing the light source central wavelength and spectral distribution.

BACKGROUND OF THE INVENTION

In the field of exposure apparatuses used in semiconductor production processes, recent years have seen powerful advances in the techniques used to miniaturize and exposure-transfer ever-finer circuitry patterns, with corresponding attempts to shorten the exposure wavelengths used in an effort to further improve resolution.

As exposure wavelengths continue to shorten, KrF and ArF excimer lasers, which are types of gas lasers, have become more common.

These excimer lasers are able to select a specific wavelength using a narrow-band module, and so can achieve generation of specific, extremely narrow-band modulated pulses of light through oscillation development. The specific wavelength is to some extent changeable.

With this type of conventional exposure apparatus, a pattern on a reticule (mask) is exposure-transferred onto a semiconductor wafer by the pulses of light generated by the excimer laser.

Figure 2A:
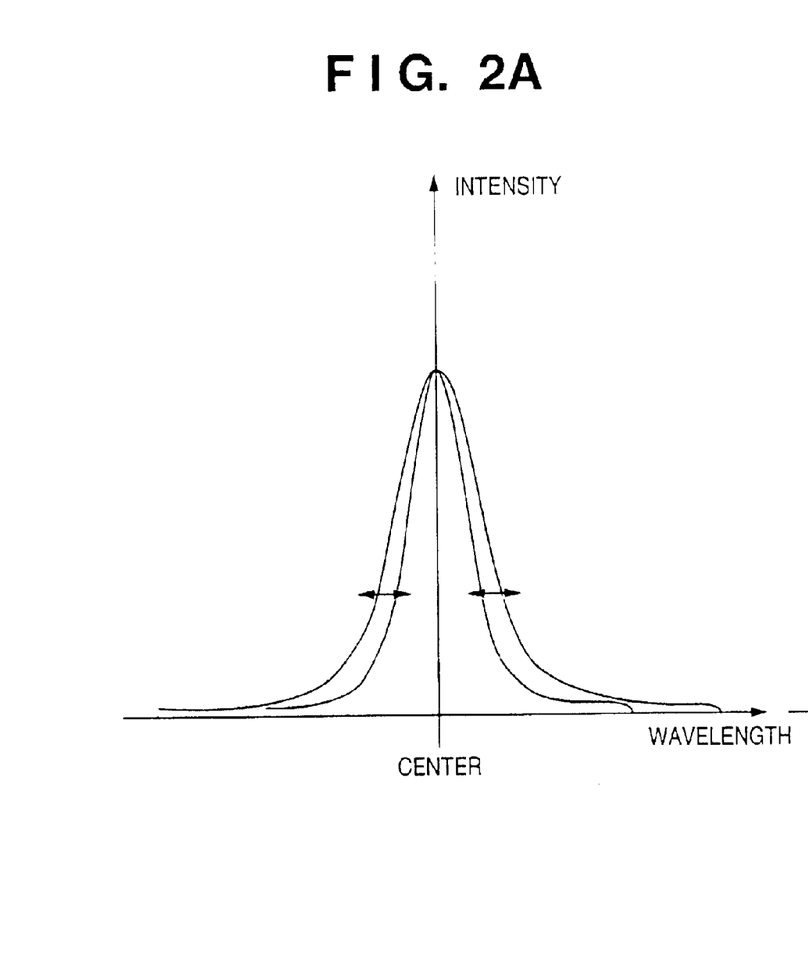
FIGS. 2A and 2B are diagrams illustrating a spectral distribution of an excimer laser.
Figure 2B:
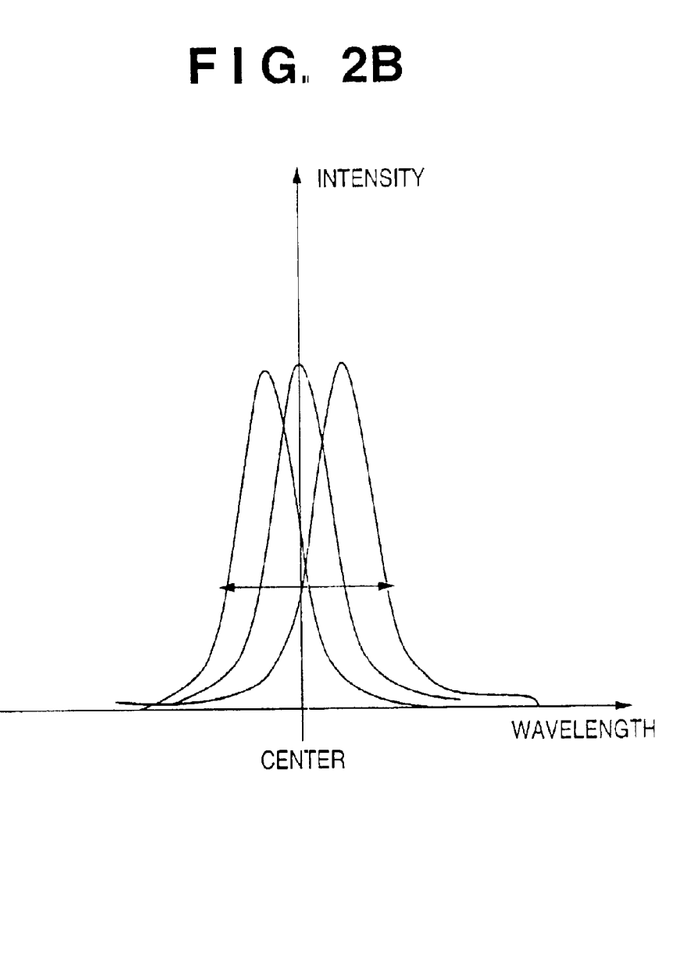

FIGS. 2A and 2B are diagrams illustrating a spectral distribution of an excimer laser.

Since the above-described laser is a gas laser, the gas must periodically be changed. However, changing the gas also changes the compositional ratio of the gas inside the chamber, and as a result the spectral distribution of the pulse sometimes also changes as shown in FIG. 2A.

Similarly, the characteristics of the optical components in the above-described narrow-band module sometimes also change over time, causing the spectral distribution to shift as well.

Similarly, the above-described excimer laser, though having the ability to hold the central wavelength constant as described above, nevertheless sometimes experiences a slight shift in central wavelength as shown in FIG. 2B due to a variety of causes internal to the excimer laser.

As described above, due to a variety of factors, the excimer laser used in exposure apparatuses is susceptible to changes in the shape of the spectral distribution and shifts in the central wavelength. If and when such changes and shifts occur, they can negatively affect the exposure apparatus's projective transfer capability.

More specifically, any shift in the width of the spectral distribution changes the contrast of the projective transfer pattern. Since the degree of impact varies depending on the pattern to be transferred, a shift in contrast not only degrades the transfer pattern contrast, but also deforms the transfer pattern itself.

In addition, if the central wavelength fluctuates, then the focus of the exposure apparatus will also change and it will become difficult to transfer fine patterns.

SUMMARY OF THE INVENTION

Accordingly, the present invention has been proposed to solve the above-described conventional problems, and has as its object to provide a light source that can reduce fluctuations in the spectral distribution and the central wavelength, a light source generation control method, an exposure apparatus and a maintenance method therefor, and a semiconductor device manufacturing method and a semiconductor production facility.

The above-described object of the present invention is achieved by a light source comprising a light-emitting element and control means for controlling light emission from the light-emitting element, with the control means controlling the light emission from the light-emitting element based on an integral spectral distribution so that the spectral distribution is held substantially constant.

Preferably, the control means causes the light-emitting element to emit light either continuously or in pulses.

Preferably, the light source further comprises measuring means for measuring the central wavelength and/or spectral distribution with each pulse or each emission time interval, with the control means controlling the light emission from the light-emitting element based -on measurements provided by the measuring means so that the spectral distribution is held substantially constant.

Preferably, the light source control means causes the light-emitting element to emit light either continuously or in pulses.

Preferably, the light source generation control method further comprises the step of measuring the central wavelength and/or spectral distribution with each pulse or each emission time interval, with the light source control means controlling the light emission from the light-emitting element based on measurements obtained in the measuring step so that the spectral distribution is held substantially constant.

In addition, the above-described objects of the present invention are also achieved by an exposure apparatus for causing a light-emitting element to emit light and exposure-transferring a pattern on a mask onto a surface of a substrate, the exposure apparatus comprising a control unit for controlling light emission from the light-emitting element based on an integral spectral distribution of an amount of light emitted by the light source so that the spectral distribution is held substantially constant.

Preferably, the light source causes the light-emitting element to emit light either continuously or in pulses.

Preferably, the exposure apparatus further comprises measuring means for measuring the central wavelength and/or spectral distribution with each pulse or each emission time interval, with the control means controlling the light emission from the light-emitting element based on measurements provided by the measuring means so that the spectral distribution is held substantially constant.

Preferably, the apparatus exposure-transfers a pattern on a mask onto a surface of a substrate by scanning the mask and the substrate relative to a projective optical system.

Preferably, the light source is an excimer laser.

In addition, the above-described objects of the present invention are also achieved by a semiconductor device manufacturing method, comprising the steps of:

installing a group of production apparatuses for producing a variety of processes, in a semiconductor production facility, such production apparatus group including the exposure apparatus; and manufacturing a semiconductor device by performing a plurality of processes using the production apparatus group.

Preferably, the semiconductor device manufacturing method further comprises the steps of connecting the production apparatus group via a local area network (LAN) and of transmitting data concerning at least one apparatus within the production apparatus group between the LAN and an external network outside the semiconductor production facility.

Preferably, maintenance information for the production apparatus is obtained by accessing a database provided by a vendor or user of the exposure apparatus via the external network and/or production control is performed by exchanging data between the semiconductor production facility and another semiconductor production facility via the external network.

In addition, the above-described objects of the present invention are also achieved by a semiconductor production facility comprising:

the production apparatus group;

a LAN that connects the production apparatus group; and a gateway adapted to provide access to an external network outside the factory from the LAN, the semiconductor production facility adapted to transmit data concerning at least one apparatus within the production apparatus group.

In addition, the above-described objects of the present invention are also achieved by an exposure apparatus maintenance method, for an exposure apparatus installed in a semiconductor production facility, comprising the steps of:

providing a maintenance database connected to an external network outside the semiconductor production facility;

enabling access to the maintenance database via the external network from inside the semiconductor production facility; and transmitting maintenance-related data stored in the maintenance database to the semiconductor production facility via the external network.

Preferably, the exposure apparatus further comprises a display, a network interface, and a computer for executing network software, with the exposure apparatus adapted to enable transmission of exposure apparatus maintenance data via a network.

Preferably, the network software provides a user interface on the display for accessing a maintenance database provided by a vendor or a user of the exposure apparatus connected to the external network outside the semiconductor production facility in which the exposure apparatus is installed, so as to enable data to be obtained from the database via the external network.

Other objects and advantages besides those discussed above shall be apparent to those skilled in the art from the description of a preferred embodiment of the invention that follows. In the description, reference is made to accompanying drawings, which form a part thereof, and which illustrate an example of the invention. Such an example, however, is not exhaustive of the various embodiments of the invention, and, therefore, reference is made to the claims that follow the description for determining the scope of the invention.

BRIEF DESCRIPTION OF THE DRAWINGS

The accompanying drawings, which are incorporated in and constitute a part of the specification, illustrate embodiments of the invention and, together with the description, serve to explain the principles of the invention, in which.

DETAILED DESCRIPTION OF THE PREFERRED EMBODIMENTS

Preferred embodiments of the present invention will be described in detail in accordance with the accompanying drawings.

It should be noted that the embodiments described below constitute examples of means to achieve the invention, and accordingly, the present invention is applicable to amendments and variations within the scope and spirit of the present invention.

Figure 1:
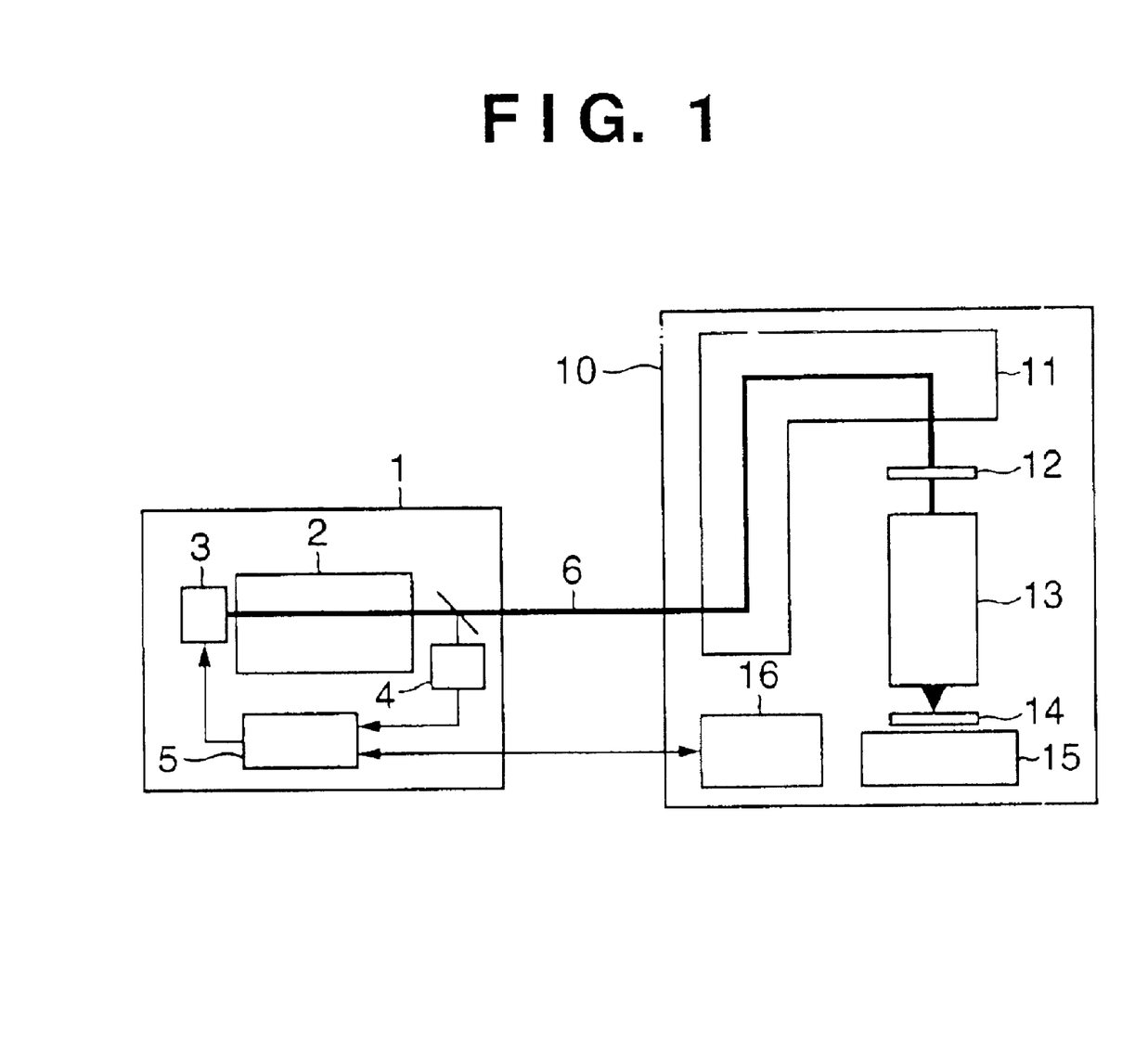
FIG. 1 depicts an exposure apparatus according to one embodiment of the present invention.

FIG. 1 depicts an exposure apparatus according to one embodiment of the present invention, featuring a step and repeat type of exposure apparatus. In FIG. 1, reference numeral 1 denotes an excimer laser that is a pulse emission light source, reference numeral 2 denotes a chamber for enclosing an excimer gas inside the laser 1, reference numeral 3 denotes a narrow-band module that selects the pulse wavelength and modulates the selected wavelength to a narrow-band, reference numeral 4 denotes a pulse cymometer for measuring the pulse central wavelength or spectral distribution, reference numeral 5 denotes a laser internal control unit that reads the central wavelength of the light pulse with every pulse using the cymometer 4 and outputs a drive control signal to the narrow-band module 3 so that the central wavelength of the succeeding pulse assumes a central wavelength command value, and reference numeral 6 denotes the excimer laser light output from the excimer laser 1.

The excimer laser 1 selects a specific wavelength using the above-described narrow-band module 3 and returns the same to the chamber 2, so the generation of a pulse having a very narrow and specific band can be achieved with an oscillation phenomenon and the above-described specific wavelength is to some extent changeable.

In addition, reference numeral 10 denotes an exposure apparatus main unit, reference numeral 11 denotes an illumination optical system for converting the light pulse generated from the excimer laser 1 onto the reticle 12 into substantially uniform illumination light to be used to illuminate a reticle 12, reference numeral 12 is the reticle that is the pattern original used to exposure-transfer the pattern onto the semiconductor wafer, reference numeral 13 is a projective lens used to transfer the pattern on the reticle 12, reference numeral 14 is a semiconductor wafer that is to be exposed, reference numeral 15 is a wafer stage on which the semiconductor wafer 14 is placed and which is capable of movement along all three dimensional axes XYZ, and reference numeral 16 is an excimer laser control unit that controls the timing of the generation of the light pulse and the level of energy of each light pulse.

The exposure apparatus described above exposure-transfers the pattern on the reticle 12 onto the semiconductor wafer 14 using the light pulse generated from the excimer laser 1.

The exposure apparatus described above transports and repositions the reticle 12 and the wafer 14, after which the pattern on the reticle 12 is transferred to the wafer in an exposure step.

Figure 4:
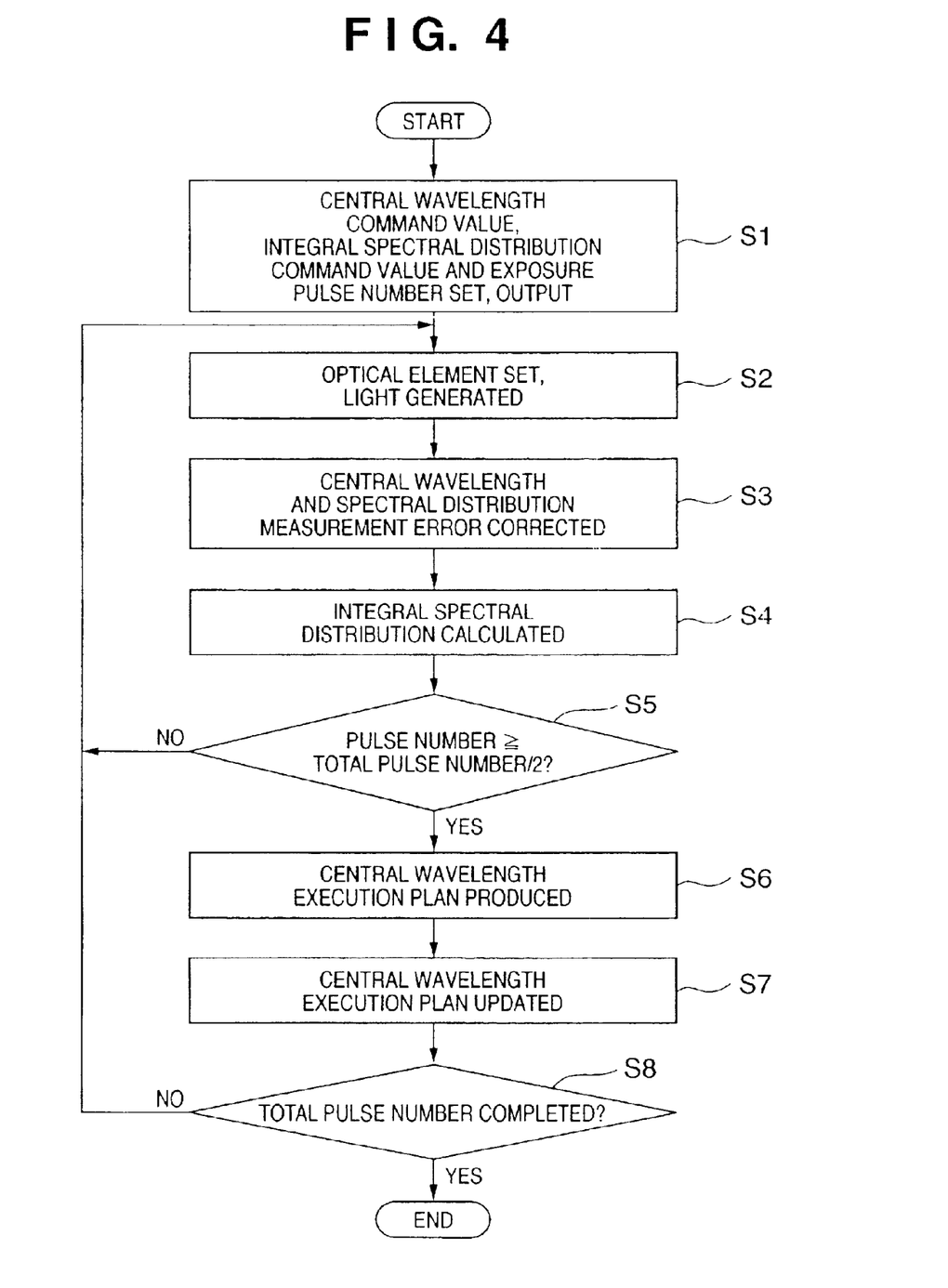
FIG. 4 is a flow chart showing an exposure control procedure according to one embodiment of the present invention.

In the exposure apparatus described above, the exposure apparatus 10 and the excimer laser 1 are fired by a controller equipped with a CPU, ROM, RAM, IO interface and communications device and the like that follows the routines laid out in the flow chart shown in FIG. 4.

Incidentally, FIG. 4 is a flow chart showing an exposure control procedure according to one embodiment of the present invention.

In a step S1, the excimer laser control unit 16 sets a central wavelength command value, an integral spectrum distribution command value, and an exposure pulse number in a laser internal control unit, after which the excimer laser control unit 16 outputs a command to generate light.

In a step S2, when the laser internal control unit 5 receives the central wavelength command value, the integral spectrum distribution command value and the exposure pulse number from the excimer laser control unit 16, the laser internal control unit 15 outputs a drive command to the narrow-band module 3 and sets an internal optical element (not shown in the diagram) to a position where it can be expected that the actual measured value and the central wavelength command value are substantially the same, after which the laser control unit 5 executes an actual exposure when an exposure command is received.

In a step S3, the laser internal control unit 5, after executing the above-described exposure, measures the central wavelength of the pulse and the spectral distribution using the cymometer 4, and corrects any discrepancy between the actually measured central wavelength and the central wavelength command value by outputting a drive command to the narrow-band module in order to minimize that discrepancy so that the central wavelength of the succeeding pulse substantially matches the central wavelength command value. In addition, the light pulse central wavelength and spectral distribution data are stored in a laser internal control unit 5 internal memory (not shown in the diagram).

In a step S4, when the laser internal control unit 5 receives the next light generation command from the excimer laser control unit 16, the laser internal control unit 5 repeats the actions performed in step 3 described above, spectral distribution data is integrated with each exposure, except that with respect to the spectral distribution, the laser internal control unit 5 carries out integration for each generation of light, and calculates the integral spectral distribution for each light pulse.

In steps S5 and S6, the laser internal control unit 5 repeatedly executes the operations described in step S4 above through approximately half of the number of exposure pulses, and thereafter for the remaining number of exposure pulses produces central wavelength execution plans for each of the remaining exposure pulses necessary for matching the integral spectral distribution and their central wavelengths to the central wavelength command values and integral spectral distribution command values. The central wavelength execution plan subtracts integral spectral distributions up to the present from the target integral spectral distribution and calculates the integral spectral distribution that should be executed for the succeeding pulse exposures, and divides the result among a spectral distribution of standard single pulses having mutually independent central wavelengths.

In steps S7 and S8, the laser internal control unit 5 sequentially updates central wavelength execution plans for every exposure pulse even after moving to the control of step S6 described above, such that, as a final exposure result, the integral spectral distribution, and its central wavelength substantially match the central wavelength command value and integral spectral distribution command value.

The mechanics of the control performed by the present embodiment will now be described in greater detail with reference to FIGS. 3A and 3B.

Figure 3A:
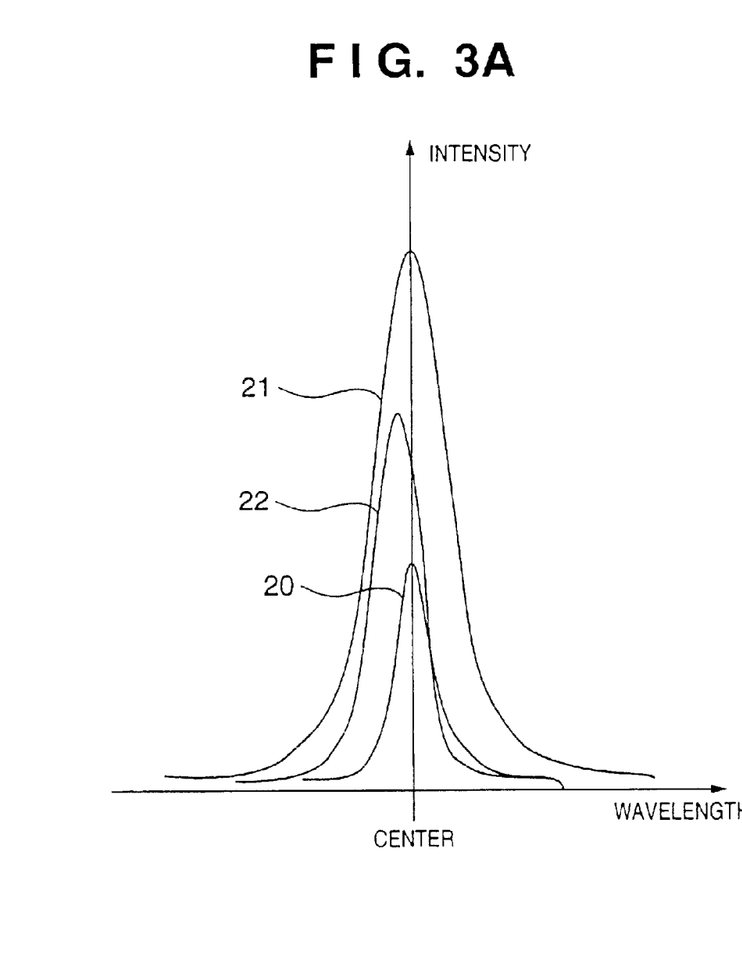
FIGS. 3A and 3B illustrate integral spectral control.
Figure 3B:
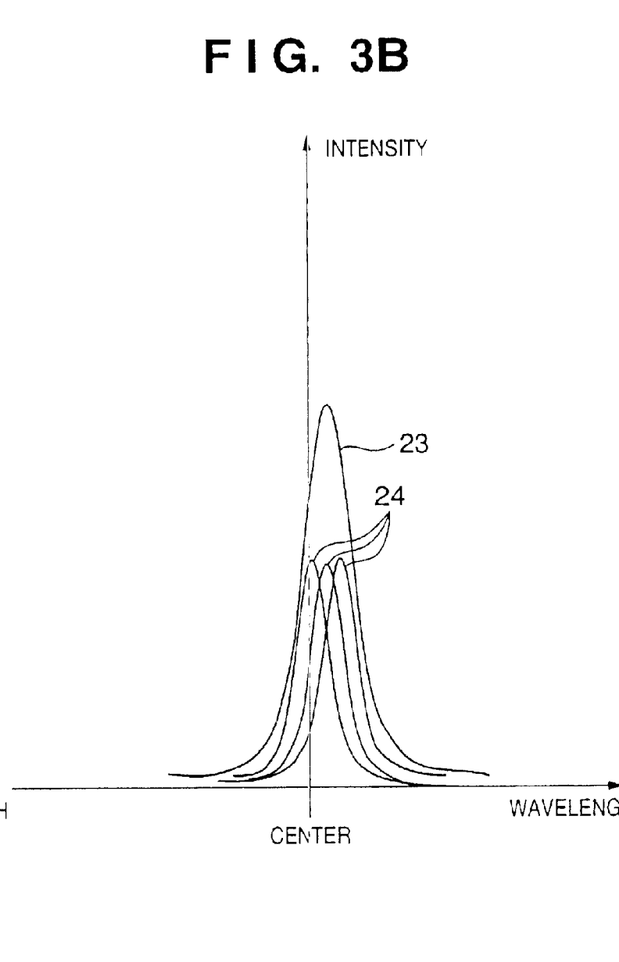

FIGS. 3A and 3B illustrate integral spectral control.

As shown in the diagram, reference numeral 20 denotes a standard spectral distribution example, reference numeral 21 denotes a target integral spectral distribution, and reference numeral 22 denotes an integral spectral distribution during exposure.

In an actual exposure process, in the above-described step S6, the integral spectral distribution 22 is subtracted from the target integral spectral distribution 21 and an integral spectral distribution to be executed for pulse generates after reference numeral 23 is calculated.

Here, the standard spectral distribution and its strength are already known, so a plurality of central wavelength command values for the purpose of achieving the necessary integral spectral distribution 23 are created.

The spectral distributions denoted by reference numeral 24 in FIG. 3B correspond to the above-described center wavelength command values.

It should be noted that in step S6 described above, the above-described "plurality of central wavelength command values" are produced and succeeding pulses of light are generated from the command wavelengths, although in the actual pulses, the central wavelength and spectral distribution change.

As a result, a central wavelength execution plan that has once been determined must be reproduced with every pulse.

The following compositions are possible as variations of the present invention:

(i) Control of the central wavelength of the above-described embodiment is carried out at the exposure apparatus.

(ii) Using a continuous emission light source with a controllable central wavelength for the light source and controlling the central wavelength at specific time intervals or in specific energy integral amounts.

(iii) In order to shorten the computation time, measuring the central wavelength and half bandwidth and computing the central wavelength command value and half bandwidth command value instead of executing spectral integration at each pulse.

(iv) Applying integral spectral distribution control to a scanner type exposure apparatus. In this case, in order for the integral spectral distribution shape to assume a predetermined volume for the number of pulses exposed at arbitrary points on all the semiconductor wafers, the central wavelength of the last pulse of a continuous number of pulses is controlled.

(Embodiment of a Semiconductor Production System)

Next, an example of a semiconductor device (e.g., semiconductor chip of IC, LSI or the like, a liquid crystal panel, a CCD, a thin film magnetic head, a micromachine, etc.) production system using the apparatus of the present invention will be described. The system performs maintenance services such as trouble shooting, periodical maintenance or software delivery for production apparatuses installed in a semiconductor manufacturing facility, by utilizing a computer network outside the production facility.

Figure 5:
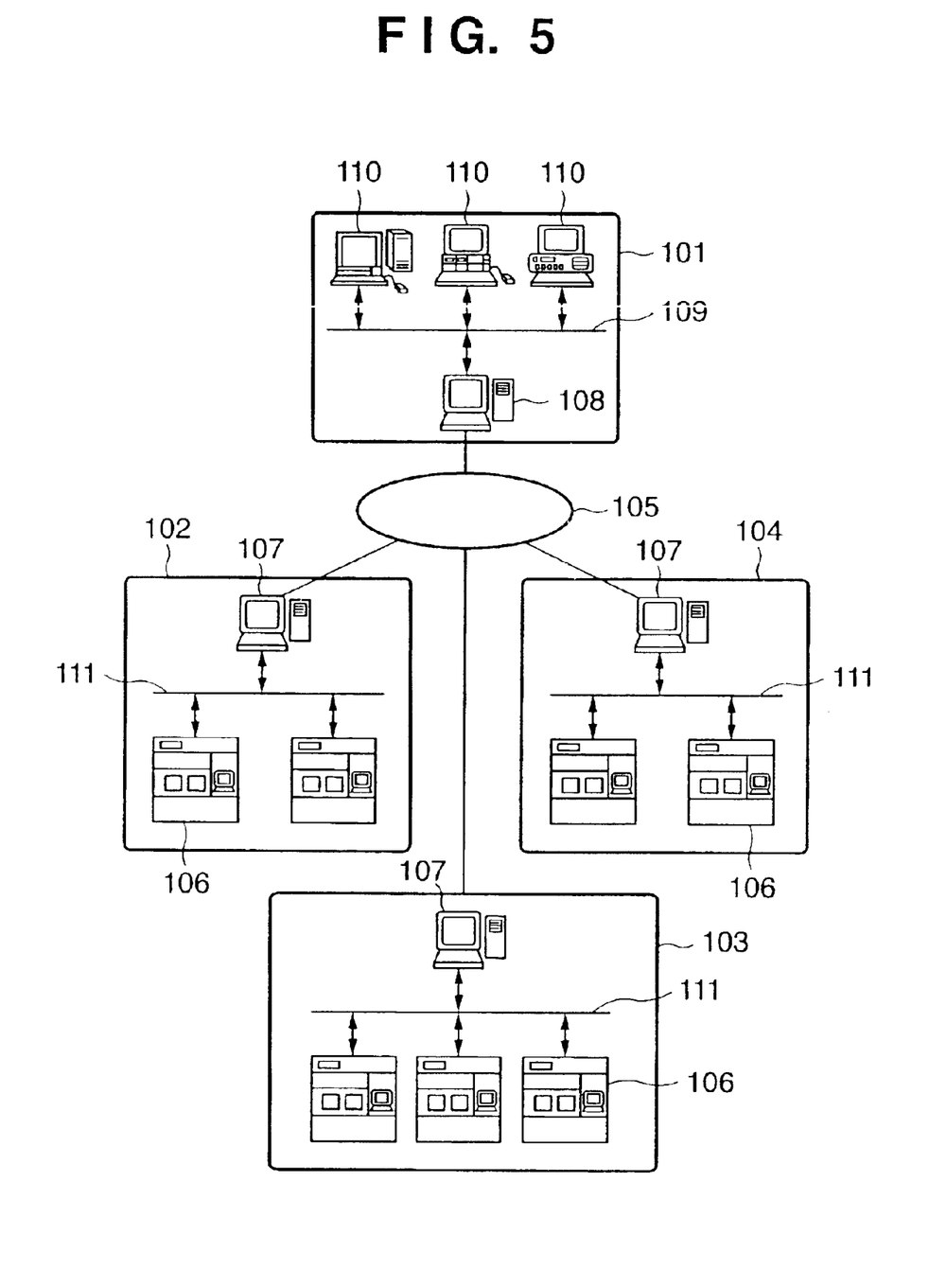
FIG. 5 is a conceptual diagram of a semiconductor device production system using the apparatus according to the embodiment, viewed from an angle.

FIG. 5 shows the entire system cut out from an angle. In the figure, numeral 101 denotes the office of a vendor (apparatus maker) of semiconductor device production apparatuses. As the semiconductor production apparatuses, apparatuses in the semiconductor production facility for performing various processes such as pre-process apparatuses (e.g., lithography apparatuses including an exposure apparatus, a resist processing apparatus and an etching apparatus, a heat processing apparatus, a film forming apparatus, a smoothing apparatus and the like) and post-process apparatuses (e.g., an assembly apparatus, an inspection apparatus and the like) are used. The office 101 has a host management system 108 to provide a maintenance database for the production apparatus, plural operation terminal computers 110, and a local area network (LAN) 109 connecting them to construct an Intranet or the like. The host management system 108 has a gateway for connection between the LAN 109 and the Internet 105 as an external network and a security function to limit access from the outside.

On the other hand, numerals 102 to 104 denotes production factories of semiconductor makers as users of the production apparatuses. The production factories 102 to 104 may belong to different makers or may belong to the same maker (e.g., pre-process factories and post-process factories). The respective factories 102 to 104 are provided with plural production apparatuses 106, a local area network (LAN) 111 connecting the apparatuses to construct an Intranet or the like, and a host management system 107 as a monitoring apparatus to monitor operating statuses of the respective production apparatuses 106. The host management system 107 provided in the respective factories 102 to 104 has a gateway for connection between the LAN 111 and the Internet 105 as the external network. In this arrangement, the host management system 108 on the vendor side can be accessed from the LAN 111 in the respective factories via the Internet 105, and only limited user(s) can access the system by the security function of the host management system 108. More particularly, status information indicating the operating statuses of the respective production apparatuses 106 (e.g., problem of a production apparatus having trouble) is notified from the facility side to the vendor side via the Internet 105, and maintenance information such as response information to the notification (e.g., information indicating measures to be taken to fix the trouble, or remedy software or data), latest software, help information and the like is received from the vendor side via the Internet. The data communication between the respective factories 102 to 104 and the vendor 101 and data communication in the LAN 111 of the respective factories are performed by using a general communication protocol (TCP/IP). Note that as the external network, a private-line network (e.g., an ISDN or the like) with high security against access from outsiders by be used in place of the Internet.

Further, the host management system is not limited to that provided by the vendor, but a database contructed by the user may be provided on the external network, to provide the plural user factories with access to the database.

Figure 6:
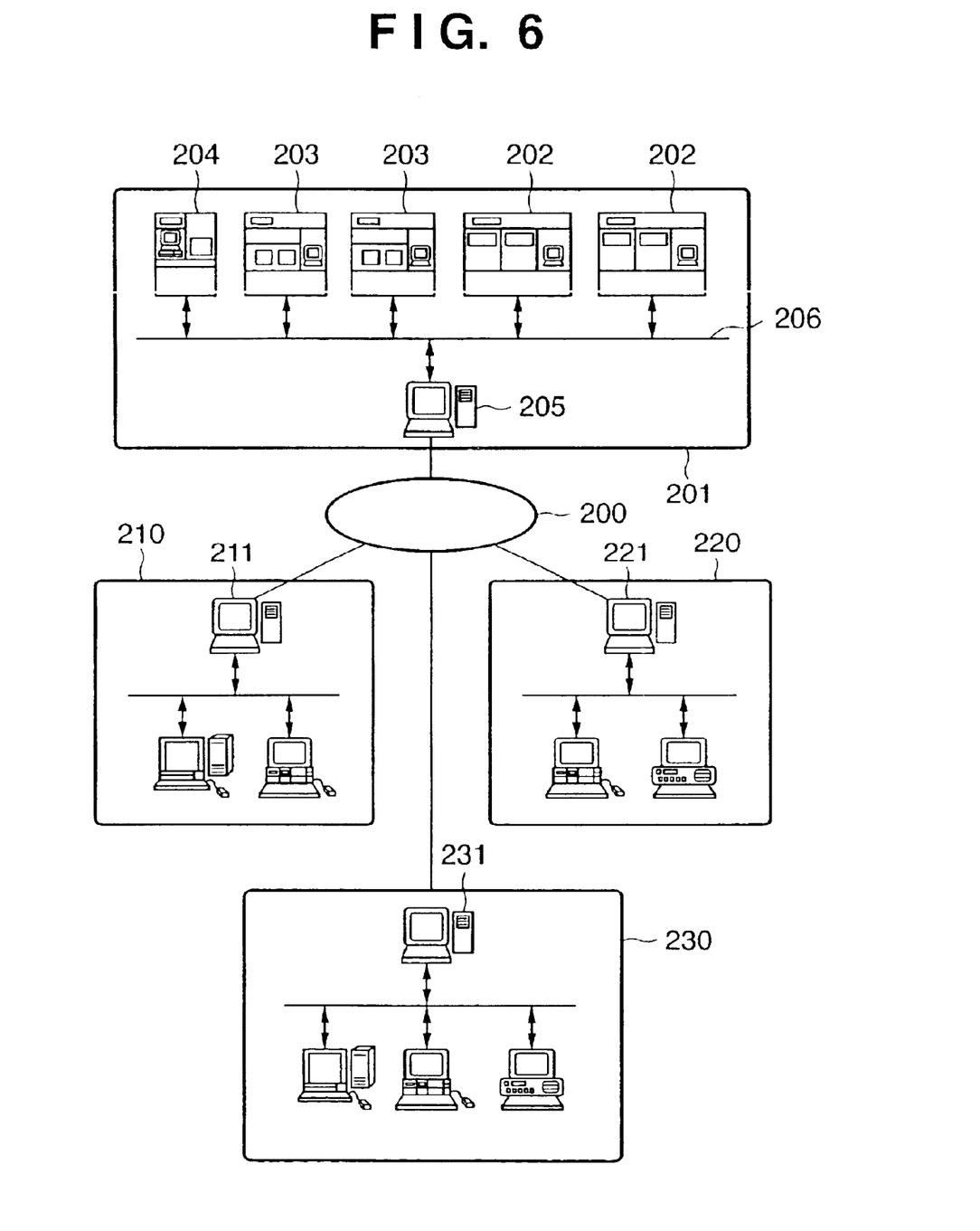
FIG. 6 is a conceptual diagram of the semiconductor device production system using the apparatus according to the embodiment, viewed from another angle.

FIG. 6 is a conceptual diagram showing the entire system of the present embodiment cut out from another angle different from that in FIG. 5. In the above example, the plural user factories respectively having production apparatuses and the management system of the apparatus vendor are connected via the external network, and data communication is performed for production management for the respective factories and transmission of information on at least one production apparatus. In this example, a facility having production apparatuses of plural vendors is connected with management systems of the respective vendors of the production apparatuses via the external network, and data communication is performed for transmission of maintenance information for the respective production apparatuses. In the figure, numeral 201 denotes a production facility of a production apparatus user (semiconductor device maker). In the facility production line, production apparatuses for performing various processes, an exposure apparatus 202, a resist processing apparatus 203 and a film forming apparatus 204, are used. Note that FIG. 6 shows only the production facility 20. However, actually plural factories construct the network. The respective apparatuses of the facility are connected with each other by a LAN 206 to construct an Intranet, and a host management system 205 performs operation management of the production line.

On the other hand, the respective offices of vendors (apparatus makers), an exposure apparatus maker 210, a resist processing apparatus maker 220, and a film forming apparatus maker 230 have host management systems 211, 221 and 231 for remote maintenance for the apparatuses, and as described above, the systems having the maintenance database and the gateway for connection to the external network. The host management system 205 for management of the respective apparatuses in the user production facility is connected with the respective vendor management systems 211, 221 and 231 via the Internet or private-line network as an external network 200. In this system, if one of the production apparatuses of the production line has trouble, the operation of the production line is stopped. However, the trouble can be quickly resolved by receiving the remote maintenance service from the vendor of the apparatus via the Internet 200, thus the stoppage of the production line can be minimized.

Figure 7:
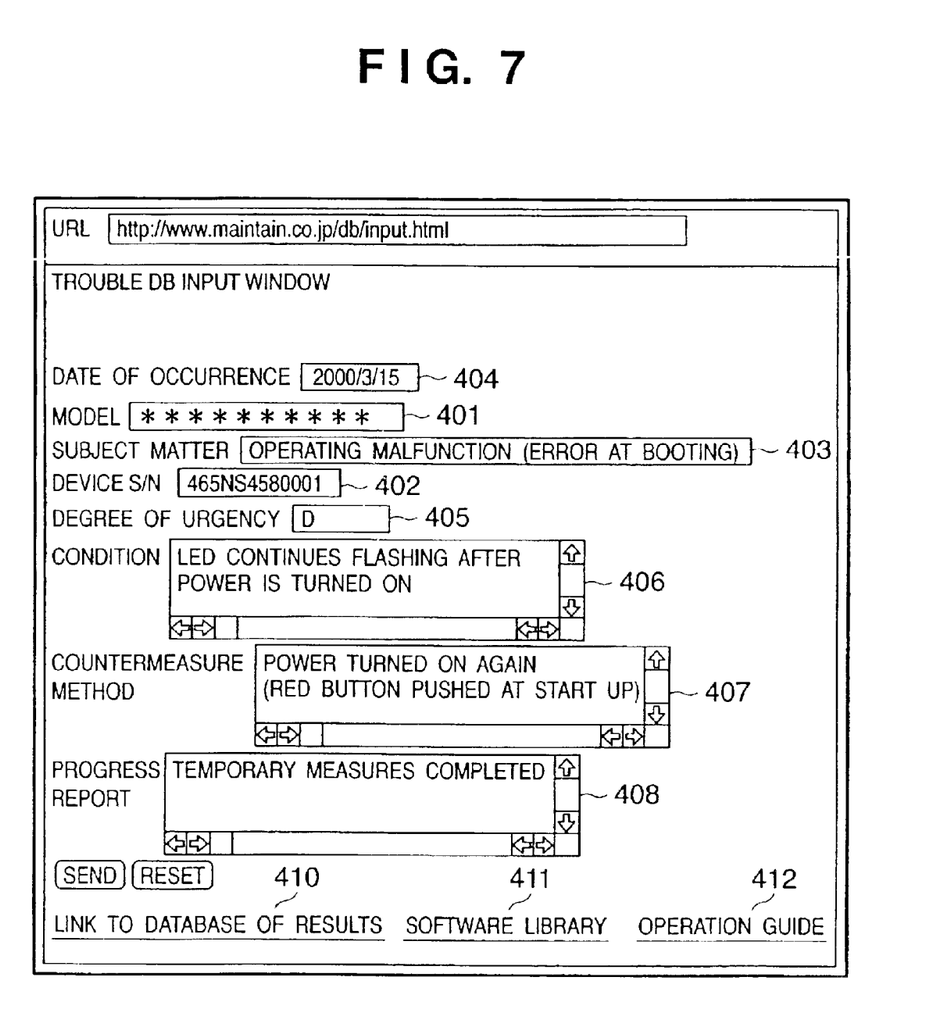
FIG. 7 is a particular example of a user interface.

The respective production apparatuses installed in the semiconductor production facility have a display, a network interface and a computer to execute network access software stored in a memory and device operation software. As a memory, an internal memory, a hard disk or a network file server may be used. The network access software, including a specialized or general web browser, provides a user interface screen image as shown in FIG. 7 on the display. An operator who manages the production apparatuses in the facility checks the screen image and inputs information of the production apparatus, a model 401, a serial number 402, a problem case name 403, a date of occurrence of problem 404, an emergency level 405, a problem 406, a remedy 407 and a progress 408, into input fields on the screen image. The input information is transmitted to the maintenance database via the Internet, and appropriate maintenance information as a result is returned from the maintenance database and provided on the display. Further, the user interface provided by the web browser realizes hyper link functions 410 to 412, as shown in the figure, and the operator accesses more detailed information of the respective items, downloads latest version software to be used in the production apparatus from a software library presented by the vendor, and downloads operation guidance (help information) for the operator's reference. The maintenance information provided from the maintenance database includes the information on the above-described present invention, and the software library provides latest version software to realize the present invention.

Figure 8:
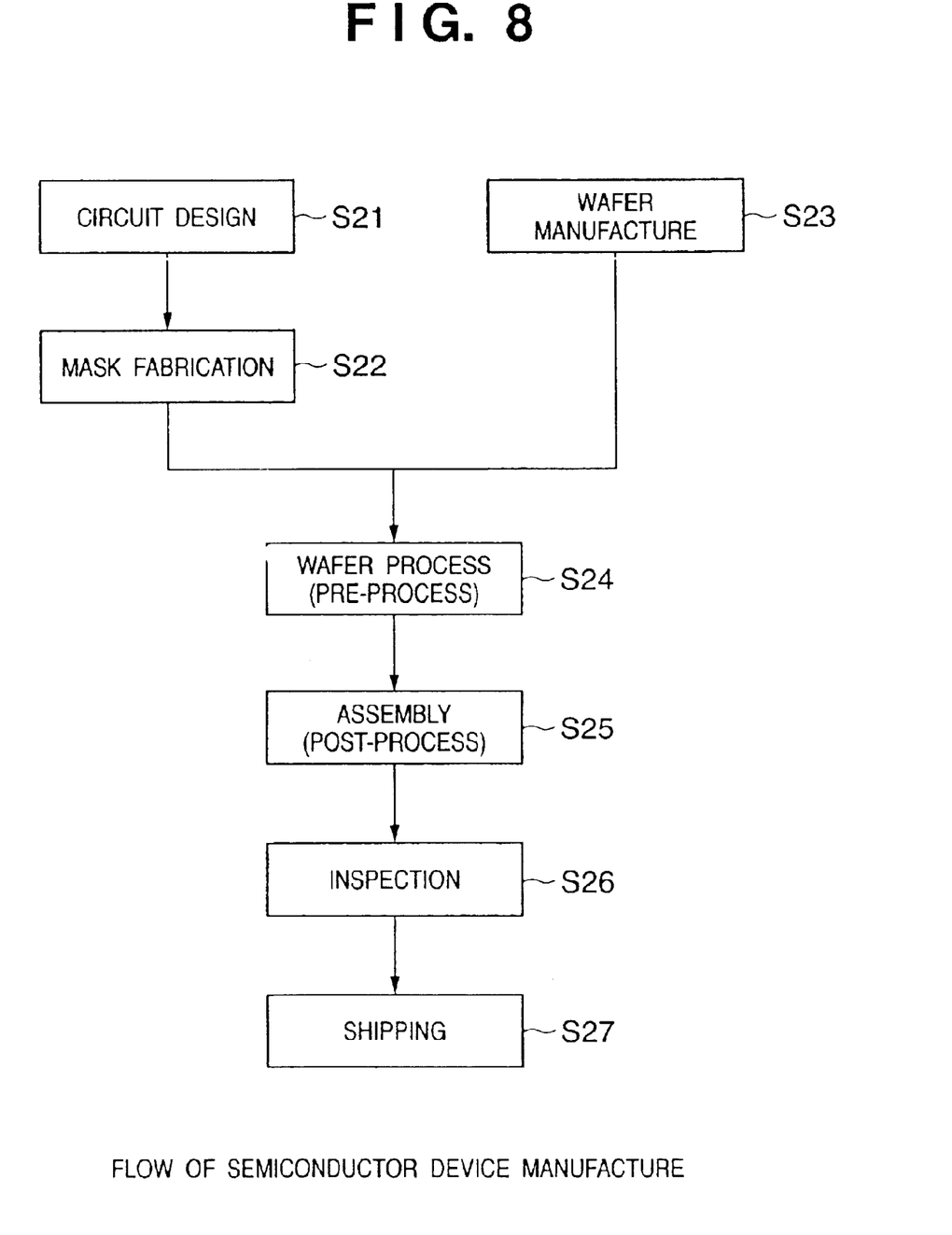
FIG. 8 is a flowchart showing a device production process.

Next, a semiconductor device production process utilizing the above-described production system will be described. FIG. 8 shows a flow of the entire semiconductor production process. At step S21 (circuit designing), a circuit designing of the semiconductor device is performed. At step S22 (mask production), a mask where the designed circuit pattern is formed is fabricated. On the other hand, at step S23 (wafer production), a wafer is fabricated using silicon or the like. At step S24 (wafer process) called a pre-process, the above mask and wafer are used. An actual circuit is formed on the wafer by lithography. At step S25 (assembly), called a post-process, a semiconductor chip is formed by using the wafer at step S24. The post-process includes processing such as an assembly process (dicing and bonding) and a packaging process (chip sealing). At step S26 (inspection), inspections such as an operation test and a durability test are performed on the semiconductor device assembled at step S25. The semiconductor device is completed through these processes, and it is shipped (step S27). The pre-process and the post-process are independently performed in specialized factories, and maintenance is made for these factories by the above-described remote maintenance system. Further, data communication is performed for production management and/or apparatus maintenance between the pre-process facility and the post-process facility via the Internet or private-line network.

Figure 9:
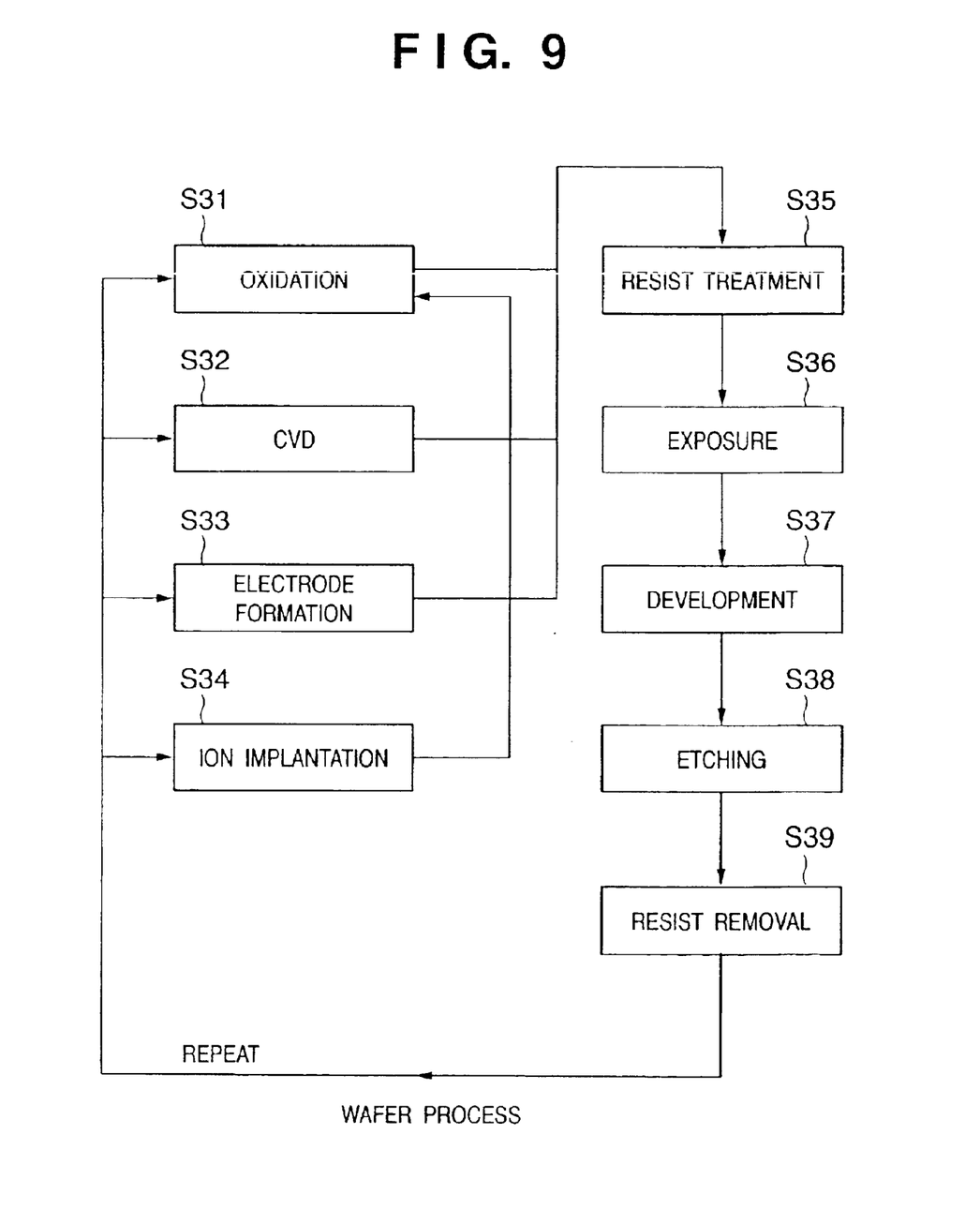
FIG. 9 is a flowchart showing a wafer process.

FIG. 9 shows a more detailed flow of the wafer process. At step S31 (oxidation), the surface of the wafer is oxidized. At step S32 (CVD), an insulating film is formed on the surface of the wafer. At step S33 (electrode formation), electrodes are formed by vapor deposition on the wafer. At step S34 (ion implantation), ions are injected into the wafer. At step S35 (resist processing), the wafer is coated with photoresist. At step S36 (exposure), the above-described exposure apparatus exposure-transfers the circuit pattern of the mask onto the wafer. At step S37 (development), the exposed wafer is developed. At step S38 (etching), portions other than the resist image are etched. At step S39 (resist stripping), the resist unnecessary after the etching is removed. These steps are repeated, thereby multiple circuit patterns are formed on the wafer. As maintenance is performed on the production apparatuses used in the respective steps by the above-described remote maintenance system, trouble is prevented, and even if it occurs, quick recovery can be made. In comparison with the conventional art, the productivity of the semiconductor device can be improved.

According to the embodiment described above, if there is a defect in the smoothness of the surface of the wafer due to the wafer process, forced exposure is possible, so that, during etching, the impact on the surrounding correctly exposed shots can be minimized, thereby improving yield.

If there is a defect in the smoothness of the surface of the wafer due to chucking, the present invention has the capability to record the location of the focus control error between wafers, so, in addition to the effect described above, any contamination of the wafer chuck can be discovered promptly.

In addition, if a control error occurs due to the impact of disturbances from the floor or the like, the present invention has the capability to interrupt exposure and reset (if before the scan exposure), thus reducing the defective exposure shot rate and thereby improving yield.

Moreover, the present invention has the capability to automatically determine the applicability of the above-described reset and forced exposure, thus minimizing the length of time the apparatus is stopped in order to await the operator's decision and thereby improving the capacity utilization.

[Other Embodiments]

The present invention includes a case in which the object of the present invention can be also achieved by providing a software program for performing the exposure control routine according to the flow chart of FIG. 4 to a system or an apparatus from a remote position, and reading and executing the program code with a computer of the system or apparatus. In such a case, the form of the software is not necessarily a program as long it has a function of a program.

Accordingly, to realize the functional processing of the present invention by computer, the program code itself installed in the computer realizes the present invention. That is, the claims of the present invention include a computer program itself to realize the functional processing of the present invention.

In such a case, other forms of programs may be used such as a program executed by object code, an interpreter and the like, or script data to be supplied to an OS (Operating System), as long as it functions as a program.

As a storage medium for providing the program, a floppy disk, a hard disk, and optical disk, a magneto-optical disk, an MO, a CD-ROM, a CD-R, CD-RW, a magnetic tape, a non-volatile type memory card, a ROM, a DVD (a DVD-ROM and a DVD-R) or the like can be used.

Further, the program may be provided by accessing a home page on the Internet by using a browser of a client computer, and downloading the computer program itself of the present invention or a compressed file having an automatic installation function from the home page to a storage medium such as a hard disk. Further, the present invention can be realized by dividing a program code constructing the program of the present invention into plural files, and downloading the respective files from different home pages. That is, the claims of the present invention also include a WWW server holding the program file to realize the functional processing of the present invention to be downloaded to plural users.

Further, the functional processing of the present invention can be realized by encrypting the program of the present invention and storing the encrypted program into a storage medium such as a CD-ROM, delivering the storage medium to users, permitting a user who satisfied a predetermined condition to download key information for decryption from the home page via the Internet, and the user's executing the program by using the key information and installing the program into the computer.

Furthermore, in addition to the functions according to the above embodiments being realized by executing the read program by a computer, the present includes a case where an OS or the like working on the computer performs a part of or an entire actual processing in accordance with designations of the program code and realizes functions according to the above embodiments.

Furthermore, the present invention also includes a case where, after the program code read from the storage medium is written in a function expansion board which is inserted into the computer or in a memory provided in function expansion unit which is connected to the computer, CPU or the like contained in the function expansion board or unit performs a part of or an entire process in accordance with designations of the program code and realizes functions of the above embodiments.

The present invention is not limited to the above embodiments and various changes and modifications can be made within the spirit and scope of the present invention. Therefore, to apprise the public of the scope of the invention, the following claims are made.

What is claimed is:

1. A light source comprising:

a light-emitting element;

control means for controlling light emission from the light-emitting element, and measuring means for measuring the central wavelength and/or spectral distribution with each pulse or each emission time interval, wherein the control means changes the central wavelength of the light emission from the light-emitting element based on measurements provided by the measuring means so that the integral spectral distribution shape at a predetermined number of pulses for emitting the light to an arbitrary point is held substantially constant.

2. The light source of claim 1, wherein the control means causes the light-emitting element to emit light either continuously or in pulses.

3. A light source generation control method of controlling a light source having a light-emitting element and control means for controlling light emission from the light-emitting element, the method comprising the steps of:

measuring the central wavelength and/or spectral distribution with each pulse or each emission time interval; and changing the central wavelength of the light emission from the light emitting element based on measurements provided by the measuring step so that the integral spectral distribution shape at a predetermined number of pulses for emitting the light at an arbitrary point is held substantially constant.

4. The light source generation control method of claim 3, wherein the light source control means causes the light-emitting element to emit light either continuously or in pulses.

5. An exposure apparatus for causing a light-emitting element to emit light and exposure-transferring a pattern on a mask onto a surface of a substrate, the exposure apparatus comprising control means for controlling light emission from the light emission element, and measuring means for measuring the central wavelength and/or spectral distribution with each pulse or each emission time interval, wherein the control means changes the central wavelength of the light emission from the light-emitting element based on measurements provided by the measuring means so that the integral spectral distribution shape at a predetermined number of pulses for emitting the light at an arbitrary point is held substantially constant.

6. The exposure apparatus of claim 5, wherein the light source causes the light-emitting element to emit light either continuously or in pulses.

7. The exposure apparatus of claim 5, wherein the apparatus exposure-transfers a pattern on a mask onto a surface of a substrate by scanning the mask and the substrate relative to a projective optical system.

8. The exposure apparatus of claim 5, wherein the light source is an excimer laser.

* * * * *